United States Patent
Rantala et al.

[11] Patent Number: 5,680,570
[45] Date of Patent: Oct. 21, 1997

[54] MEMORY SYSTEM WITH DYNAMICALLY ALLOCATABLE NON-VOLATILE STORAGE CAPABILITY

[75] Inventors: Joseph F. Rantala, Worcester; John K. Grooms, Webster; Charles F. Cassidy, Northboro, all of Mass.

[73] Assignee: Quantum Corporation, Milpitas, Calif.

[21] Appl. No.: 316,057

[22] Filed: Sep. 30, 1994

Related U.S. Application Data

[63] Continuation of Ser. No. 714,300, Jun. 12, 1991, abandoned.

[51] Int. Cl.⁶ .................... G06F 11/16; G06F 12/08
[52] U.S. Cl. .................... 395/440; 395/431; 395/432; 395/489; 395/471; 395/483; 395/182.04
[58] Field of Search .................... 395/440, 489, 395/431, 432, 471, 472, 483, 465, 466, 182.04

[56] References Cited

U.S. PATENT DOCUMENTS

| | | | |
|---|---|---|---|
| 4,122,531 | 10/1978 | Tamaru et al. | 365/230.03 |
| 4,327,410 | 4/1982 | Patel et al. | 395/489 |
| 4,342,079 | 7/1982 | Stewert et al. | 395/405 |
| 4,439,829 | 3/1984 | Tsiang | 395/445 |
| 4,545,035 | 10/1985 | Guterman et al. | 365/185.08 |
| 4,564,922 | 1/1986 | Muller | 395/488 |
| 4,654,819 | 3/1987 | Stiffler et al. | 395/489 |
| 4,716,552 | 12/1987 | Maltiel et al. | 365/222 |
| 4,763,333 | 8/1988 | Byrd | 395/182.2 |
| 4,885,680 | 12/1989 | Anthony et al. | 395/471 |
| 4,959,774 | 9/1990 | Davis | 395/182.04 |
| 5,155,844 | 10/1992 | Cheng et al. | 395/183.12 |
| 5,226,009 | 7/1993 | Arimoto | 365/189.04 |
| 5,239,640 | 8/1993 | Froemke et al. | 395/180 |
| 5,269,019 | 12/1993 | Peterson et al. | 395/621 |
| 5,359,713 | 10/1994 | Moran et al. | 395/812 |

*Primary Examiner*—Eddie P. Chan
*Assistant Examiner*—Reginald G. Bragdon
*Attorney, Agent, or Firm*—David B. Harrison

[57] ABSTRACT

A memory system having volatile storage of data destined for secondary storage and smaller intermediate non-volatile storage of some of the data. The volatile memory is an array of DRAM storage devices integrated with the non-volatile memory array of SRAM devices by a mapping logic unit. The DRAM array stores all the data blocks destined for secondary storage. In contrast, the smaller SRAM array stores only the data requiring safe storage, which typically is a subset of the data stored in the DRAM array. The mapping logic unit manages the use of the SRAM array.

24 Claims, 9 Drawing Sheets

PAGE STACK
| ADDR | DATA |
|------|------|
| 0 | 0 |
| 1 | 1 |
| 2 | 2 |
| 3 | 3 |
| 4 | 4 |
| 5 | 5 |
| ⋮ | ⋮ |
| N−1 | N−1 |
| N | N |
POINTER 46 ←
40, 42, 44
FIG.−6
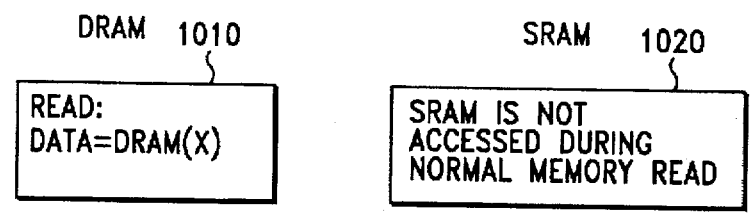
FIG.−10
FIG.−10A

MEMORY SYSTEM WITH DYNAMICALLY ALLOCATABLE NON-VOLATILE STORAGE CAPABILITY

This application is a continuation of application Ser. No. 07/714,300, filed Jun. 12, 1991 now abandoned.

FIELD OF THE INVENTION

This invention relates generally to non-volatile memory systems and more specifically to a memory arrangement capable of dynamically allocating portions of a non-volatile storage array to provide "safe storage" of data prior to transferring the data to secondary storage media.

BACKGROUND OF THE INVENTION

In a computer configured as a "client-server" system, the clients or individual users of the system have access to shared resources coupled to the server. The "client" may be a terminal, work station or small computer system. The server is typically a general-purpose computer having an input/output (I/O) subsystem consisting of secondary storage devices, such as magnetic disks or tapes, which are "shared" by the clients.

Typical applications run on a client-server computer system include transactional processing and real-time data acquisition applications. These applications require fast data access to and from storage devices capable of preserving or "safely storing" the acquired data. Safe storage implies storage of data on secondary storage media instead of volatile memory such as dynamic random access memory (DRAM) devices. The DRAM devices require frequent refresh operations to maintain their stored data contents and are subject to loss of stored data when power to the devices is interrupted. In contrast, the data stored on secondary media is impervious to power failures.

Previously, the server relied upon extensive control capability, usually provided by software, to manage the data requests of the clients. For example, only portions of the data received from the clients may need safe storage. The data requests are prioritized in terms of I/O transactions initiated by the server to transfer the data to secondary storage media. Such management and prioritization procedures are time-consuming. Also, servicing of an I/O transaction request is a fairly slow process; these requests then create a bottleneck that limits the number of clients a server may service. Moreover, if a system power failure occurs while an I/O request is waiting to be serviced, data may be permanently lost.

One approach to resolving the bottleneck problem involves the use of a non-volatile memory unit within the server to provide an intermediate form of safe storage capability. The non-volatile unit comprises a memory module populated solely with static random access memory (SRAM) devices and batteries for backup power to the unit. However, the use of such memory is fairly limited since the total amount of storage capacity at reasonable cost is small compared to traditional dynamic memory systems.

It is an object of the present invention to provide a memory subsystem arrangement having intermediate, non-volatile storage of data destined for safe storage on secondary media.

It is an object of the present invention to provide a memory subsystem arrangement that significantly reduces performance bottlenecks involved in direct data transfers to secondary storage media.

It is also an object of the present invention to provide a memory subsystem arrangement that allows the non-volatile storage capability to be allocated to any I/O device or function in the computer system.

It is another object of the present invention to provide a memory subsystem arrangement that integrates non-volatile and volatile storage components to provide cost-effective and efficient use of the non-volatile storage capability.

SUMMARY OF THE INVENTION

Briefly, in a memory system embodying the invention, a volatile memory array composed of dynamic random access memory (DRAM) storage devices is integrated with a smaller non-volatile memory array composed of static RAM (SRAM) devices by a mapping logic unit to provide a flexible, non-volatile storage capability. The DRAM array stores all data blocks including those destined for secondary storage media. In contrast, the SRAM array stores only the data requiring safe storage, which is a subset of the data stored in the DRAM array. The mapping logic unit manages the use of the SRAM array.

The mapping logic unit includes a page stack array and a tag array. The tag array provides information linking portions, e.g. pages, of the SRAM array, to pages of data stored in the DRAM array. The SRAM pages are used to shadow, i.e. maintain exact copies of, the data stored in pages of the DRAM array. The page stack array maintains a list of available pages in the SRAM array for shadowing selected pages of the DRAM array.

An advantage of this arrangement is flexible allocation of pages of the SRAM array to pages of data in the DRAM array. That is, the SRAM pages are assigned to shadow pages of the DRAM array exactly where shadowing of the latter array is needed. This results in a powerful, cost-effective memory arrangement as compared with prior intermediate memory systems using larger non-volatile SRAM arrays.

BRIEF DESCRIPTION OF THE DRAWINGS

The above and further advantages of the invention may be better understood by referring to the following description in conjunction with the accompanying drawings, in which:

FIG. 6 is a diagram illustrating an initialized page stack of FIG. 4;

FIG. 10 is a diagram illustrating the sequence of steps occuring in the memory arrangement of FIG. 2 during a read operation;

FIG. 10A is a diagram illustrating the read operation of FIG. 10;

DETAILED DESCRIPTION OF ILLUSTRATIVE EMBODIMENTS

Figure 1:
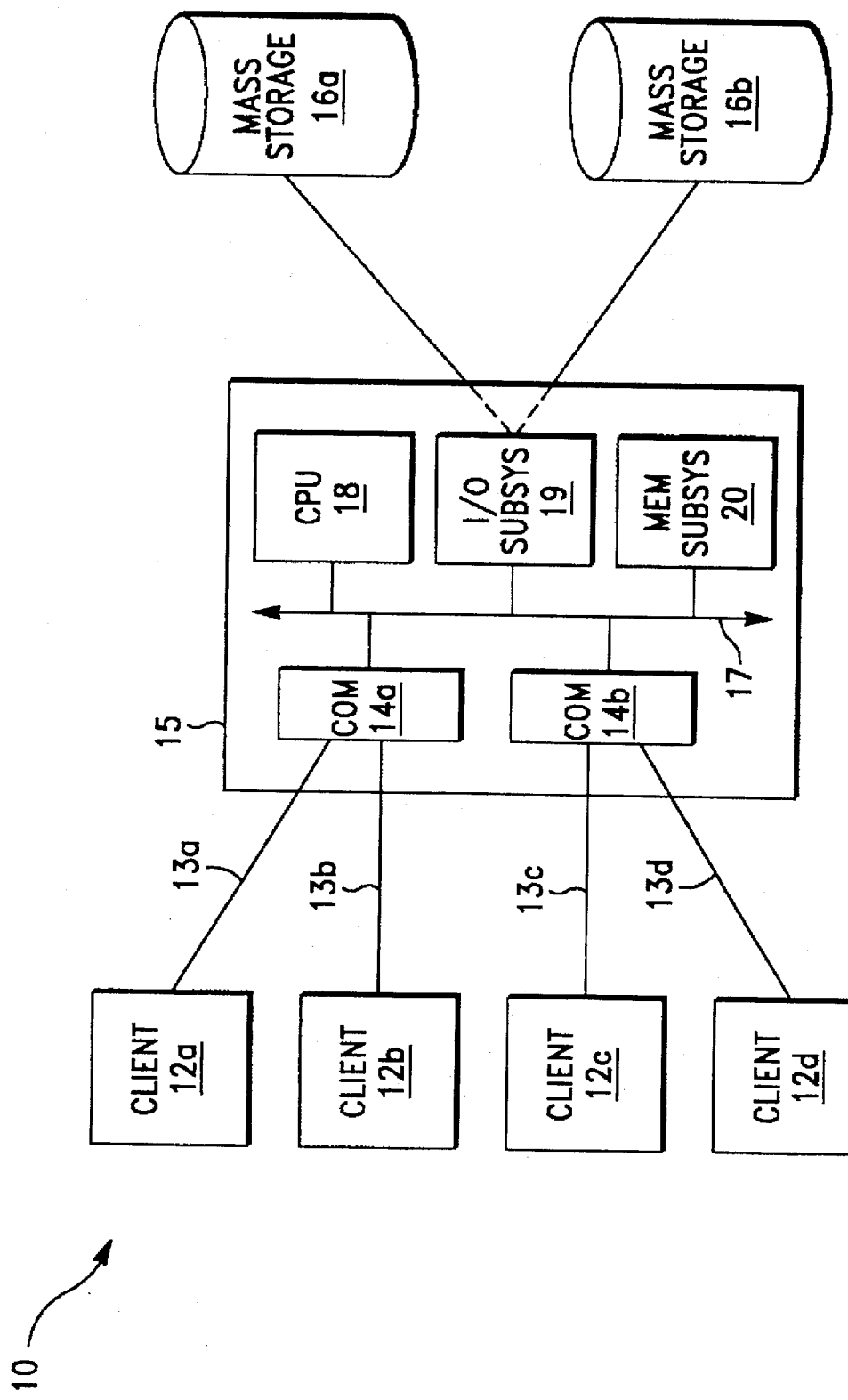
FIG. 1 is a diagram of a client-server computer system configuration in which the memory arrangement of the present invention may be advantageously used.

Referring to FIG. 1, a "client-server" computer system 10 includes a "server" component 15 configured to perform a particular function for multiple users or "clients" 12a–d. More specifically, the client-server system 10 is configured to perform frequent accesses to secondary storage media, shown in the diagram as mass storage devices 16a,b. The clients 12a–d are typically terminals or small computers coupled to a communications subsystem 14a,b of the server 15 via interconnection cables 13a–d. The mass storage devices 16a,b are, for example, magnetic disk or tape drives capable of storing and maintaining large amounts of data. The storage devices 16 are coupled to an I/O subsystem 19 of the server 15.

The server 15 is, for example, a general-purpose computer system including a central processing unit (CPU) 18 and a memory subsystem 20 connected to the communications subsystem 14a,b and I/O subsystem 19 by a server system bus 17. The server 15 could also be configured as a host computer, an intelligent storage controller or an intelligent storage device. The CPU 18 executes instructions and processes data in accordance with application programs associated with the respective clients 12. The applications typically involve transactional processing and real-time data acquisition, i.e. applications requiring the preservation or "safe storage" of acquired data.

Figure 2:
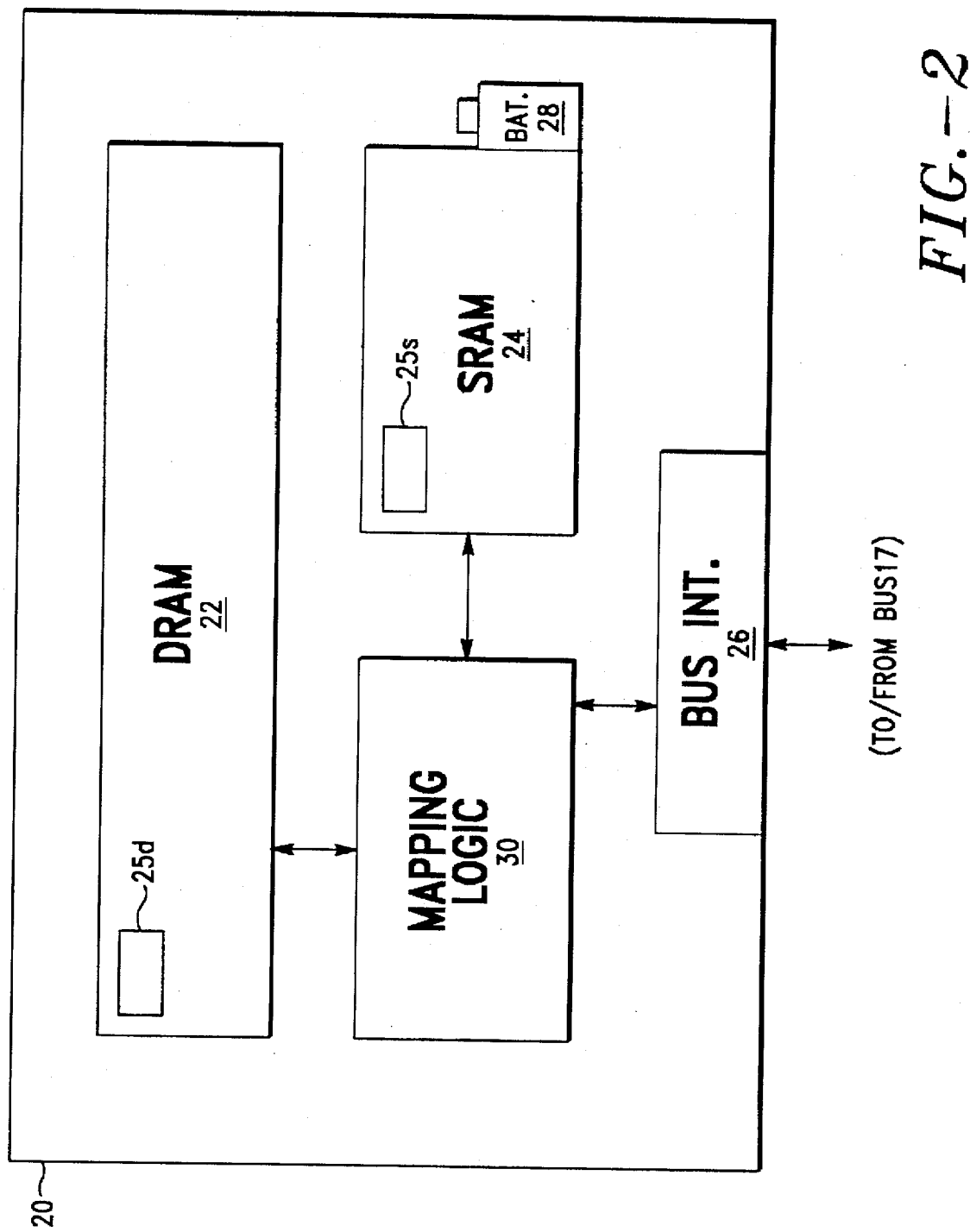
FIG. 2 is a diagram of the memory arrangement of FIG. 1 including a memory subsystem with volatile and non-volatile storage capability.

Refer also to FIG. 2. The memory subsystem 20 provides both volatile and non-volatile, i.e. safe, storage of data for the computer system 10. The memory subsystem 20 includes a small non-volatile storage array 24 integrated with a relatively large volatile storage array 22 by a mapping unit 30 to provide a flexible, non-volatile storage capability. For the typical applications mentioned above, only certain selected blocks of data transferred by a client 12 to the server 15 require safe storage within the memory 20 prior to reaching mass storage devices 16. Accordingly, each array is apportioned into a number of address blocks, i.e. "pages", shown generally at 25. The size of a page 25 is equal to the size of a typical data block, for example 512 bytes. The memory arrangement allocates the non-volatile pages $25_s$ as needed to safely store the selected data blocks, which are also stored in corresponding volatile pages $25_d$.

The volatile storage array 22 is composed of dynamic random access memory (DRAM) devices. The non-volatile array 24 is provided by static random access memory (SRAMs) devices having bandwidth characteristics comparable to those of traditional memory subsystems, i.e. much greater than those of magnetic disk or tape devices. The DRAM array 22 stores all data via write operations issued by the CPU 18 to the memory subsystem 20; only a subset of the data is stored in the SRAM array 24. More specifically, the memory arrangement, in conjunction with the system software, dynamically allocates the SRAM array 24 on a page-by-page basis to "shadow" a subset of data stored in pages of the DRAM array 22. This subset of data must be safely preserved until eventual transfer to a mass storage device. Once the data is stored on a mass storage device, the SRAM pages can be subsequently "deallocated".

The CPU 18 initiates the allocation process by executing a shadow page allocation routine, which has as an input a physical page address in the DRAM array 24. The CPU 18 issues a command to the memory subsystem 20 that logically links the physical page address to an address of a page in the SRAM array 24. The address of the SRAM page is chosen from a pool of unassigned SRAM pages. The allocated SRAM page is then configured to "shadow" the data stored in the DRAM page. The CPU 18 also initiates the deallocation process by executing a shadow page deallocation routine. That, is, the CPU 18 issues a command to the memory subsystem to remove a page of SRAM from "shadow mode" and place it back into the pool of unassigned SRAM pages. The operation of the memory arrangement in response to the shadow page allocation command and the shadow page deallocation command is described below in connection with FIGS. 7 and 8, respectively.

These allocation and deallocation commands are initiated by the CPU 18 in preparation for an I/O transaction; accordingly, they are separate and distinct from read and write operations. For example, if a client's application requires the safe storage of certain data, the CPU 18 requests the allocation of a sufficient number of pages in the SRAM array 24 to shadow the data stored at the physical DRAM page addresses. Later, the CPU 18 executes a data transfer routine to transfer the data from the shadowed DRAM pages to the mass storage devices 16. Specifically, the physical addresses of the pages in DRAM array 22, i.e. source addresses, and the, page addresses in the mass storage devices 16, i.e. destination addresses, are needed to "copy" the data. The CPU 18 may then initiate deallocation of the SRAM pages, thereby making them available for use elsewhere. The CPU 18 instructs the memory subsystem 20 of these events using the physical addresses presented to the DRAM array 22 because the CPU 18 does not directly interact with the SRAM array 24. As described further herein, the mapping logic unit 30 manages the use of pages in the SRAM array 24.

In a typical embodiment of the invention, the DRAM array 22 has 32 Mbytes of storage capacity and thus contains 64K 512-byte pages. The SRAM array 24, which is smaller, has 2 Mbytes of storage capacity and thus contains 4K pages. Thus, unlike prior intermediate memory systems, much costly SRAM capacity is eliminated.

The memory subsystem 20 also includes bus interface circuitry 26 and a mapping logic unit 30. The bus interface circuitry 26 couples the memory system 20 to the server bus 17 and contains the circuitry needed to ensure that the memory subsystem 20 meets the timing and electrical characteristics for receiving and transmitting data to and from other server components. The mapping logic unit 30 contains the data path logic for coupling the bus interface 26 to the DRAM array 22 and SRAM array 24. The mapping logic unit 30 also includes the data structures needed to manage the safe storage of certain data. A more detailed description of the mapping logic unit 30 is provided below in connection with FIG. 3.

As noted, the DRAM array 22 temporarily stores all data involved in read and write operations issued by the CPU 18. The DRAMs in array 22 require constant refresh operations to maintain the accuracy of data stored therein; thus the array is volatile in that the data will be lost when the computer system 10 loses power. The SRAM array 24, on the other hand, is supplied with power either by the system 10 during normal operation or by batteries 28 coupled to the array 24 when the system 10 is powered down. Accordingly, the SRAM array 24 functions as non-volatile interim storage of data designated to be safely stored on mass storage devices. The data stored in the SRAM array 24 is thus safe from a power loss of the computer system 10. Upon recovery from the power loss, a power loss data recovery routine is called and executed by the CPU 18. The recovery process is described below in connection with FIG. 11.

Figure 3:
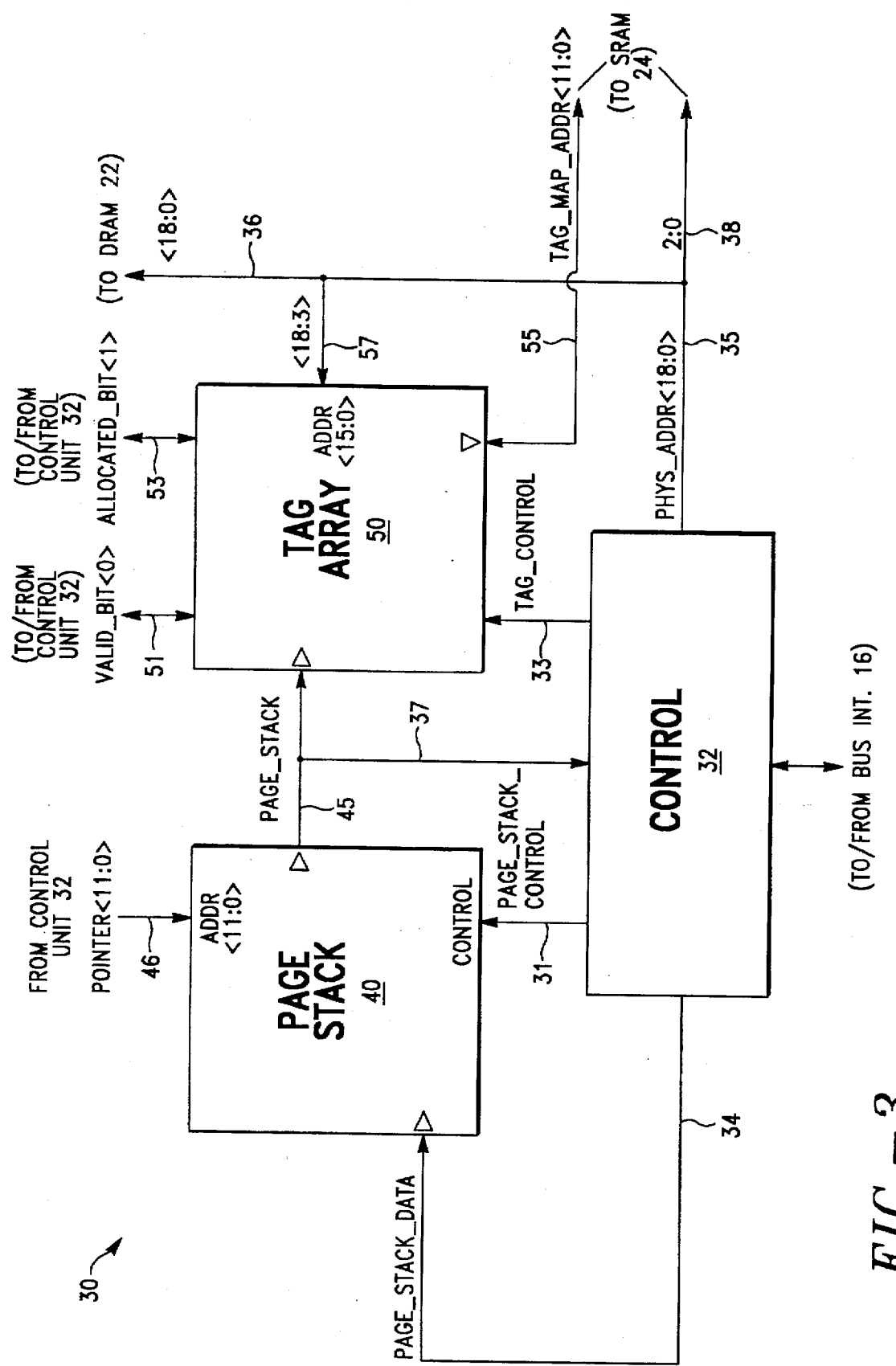
FIG. 3 is a diagram of the mapping logic portion of the memory arrangement of FIG. 2.

FIG. 3 is a block diagram of the mapping logic unit 30. Logic unit 30 includes a page stack 40 and a tag array 50 connected to a control unit 32. The control unit 32 generates timing and control signals associated with the safe storage of certain data in the memory subsystems 20. More specifically, the control unit 32 provides a group of signals, i.e. PAGE_STACK_CONTROL, on line 31 to the page stack 40 to enable storage and retrieval of SRAM page addresses contained within the stack array 40. Similarly, a group of TAG_CONTROL signals on line 33 enable the storage and retrieval of information contained in the tag array 50. As described in detail below, the page stack 40 and tag array 50 respond to the allocation and deallocation requests issued by the CPU 18; the tag array 50 also responds to read and write requests issued to the memory subsystem 20.

The control unit 32 also provides translation of addresses received from the CPU 18 to addresses recognizable by the SRAM and DRAM arrays. More specifically, the control unit 32 provides a 19-bit address, PHYS_ADDR <18:0>, on line 35 for use by the DRAM array 22 and SRAM array 24 during read and write operations. Since all data transactions with the memory subsystem 20 involve the DRAM array 22, the entire 19-bit address is provided to the array 22 on line 36 via line 35 to access corresponding DRAM locations. The fifteen (15) higher-order address bits <18:3> are provided on line 57 to the tag array 50 to access certain locations therein. The three (3) lower-order address bits <2:0> are provided on line 38 to the SRAM array 24, where they are appended to the contents of a corresponding tag array entry to allow access to all addresses within the "shadow" page in the array 24, as described further below.

Figure 4:
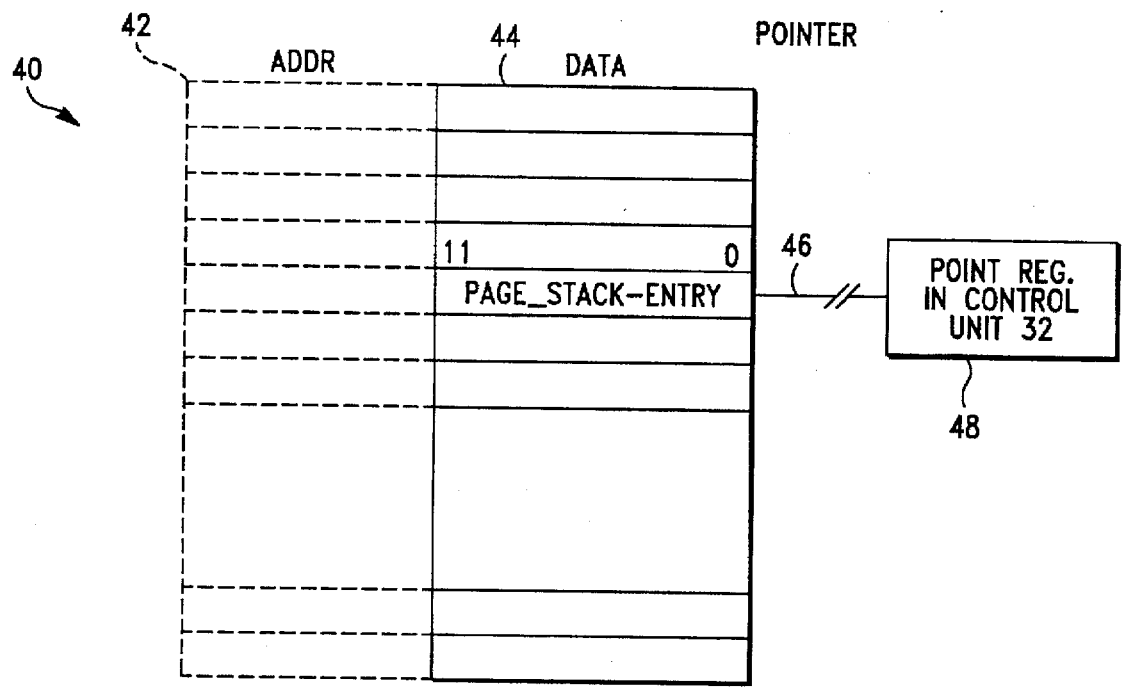
FIG. 4 is a diagram of the page stack used in the mapping logic of FIG. 3.

As shown in FIG. 4, the page stack 40 provides the accounting functions needed to manage the SRAM array 24. More specifically, the page stack 40 contains a list of available pages in the SRAM 24, i.e. those pages that are not assigned to shadow DRAM pages. The page stack 40 is an array with data and address fields referenced by a pointer. Each data field 44 contains a page stack entry, e.g. PAGE_STACK_ENTRY <11:0>, which is a 12-bit address of a page in the SRAM array 24. The address field 42 contains the address of each entry in the page stack 40, while the stack pointer 46 "points" to the address of the next SRAM page to be allocated. The stack pointer 46 is a register 48 located in the control unit 32. In the embodiment described herein, the page stack 40 has a capacity of 4K addresses, i.e. one for each page in the SRAM array 24.

Operationally, the page stack 40 is initialized with values representing addresses of the pages in the SRAM array 24. That is, each data field 44 in the stack 40 is sequentially loaded with a value ranging from 0–4K, with each value representing a SRAM page address. This is illustrated in FIG. 6. The pointer 46 "points" to a location in the stack 40 that identifies the address of a non-allocated page in the SRAM array 24, i.e. the address of the next SRAM page to be allocated. In general, once the page becomes allocated, the pointer 46 increments and points to the next sequential location in the stack 40. Thereafter, when a SRAM page is subsequently deallocated, its page address is placed "on top" of the stack of available SRAM pages; that is, the deallocated SRAM page address is inserted into the page stack location immediately above the location identified by the pointer 46. The pointer 46 then decrements and points to the deallocated page address. When the value in the pointer 46 reaches 4K, the stack 40 is empty and there are no unallocated SRAM pages.

Figure 5:
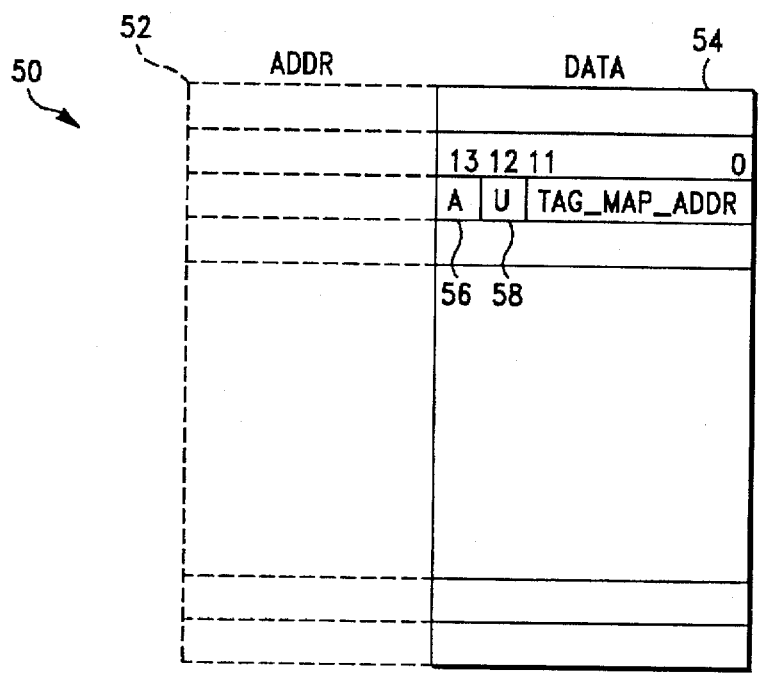
FIG. 5 is a diagram of the tag array used in the mapping logic of FIG. 3.

The tag array 50, depicted in FIG. 5, contains a mapping of selected pages in the DRAM array 22 to the pages in the SRAM array 24. In accordance with the invention, the contents of the SRAM pages "shadow" the contents of the selected DRAM pages. The tag array 50 includes both data and address fields. Each address field 52 contains an address of a tag entry. The address of a tag entry is derived from the physical address of a page in the DRAM array 22. Each data field 54 contains a tag entry, i.e. TAG_MAP_ADDR <11:0>, identifying a portion of the address of a page of data stored in the SRAM array 24. There is an address entry in the tag array 50 for each page of the DRAM array 22. Thus, in the embodiment described herein in which the DRAM array 22 contains 64K pages, the tag array 50 has 64K addresses.

In addition, each data field 54 contains means for determining whether a particular page in the SRAM array 24 is allocated and whether that page contains valid data. As embodied herein, such means may include an allocate field 56 and a valid field 58. The allocate field 56 is a 1-bit field that indicates whether a page in the SRAM array 24 has been allocated to "shadow" a corresponding page in the DRAM array 22. The valid field 58 is a 1-bit field that indicates whether the "shadowing" page in SRAM array 24 has received data via a write operation. If the bit is set, then data has been stored in the SRAM location prior to completion of an I/O transaction to a mass storage device, i.e. the data is valid. If the bit is clear, either a write operation has yet to occur in the corresponding SRAM page or the data stored in that page of SRAM has been transferred to mass storage; i.e. the data is now invalid.

Refer again to FIG. 3. The tag array 50 coordinates the shadowing of the DRAM pages by corresponding SRAM pages. The tag array 50 shares a portion of its address space with the DRAM array 22; that is, physical address bits <18:0> are sent to the DRAM array 22 on line 36 in conjunction with a read or write operation, while the higher-order address bits <18:3> are sent to the tag array 50 on line 57. The address identifying the SRAM page allocated to shadow the DRAM page, i.e. PAGE_STACK_ENTRY <11:0> on line 45, is stored in a portion of the data field 54 of the tag array 50 referenced by the sixteen higher-order address bits. These physical address bits <18:3> become address bits <15:0> within the tag array 50, which enable access to 64K addresses/pages in the DRAM array 22. The 12-bit address located in the data field 54 of the tag array 50, now referred to as TAG_MAP_ADDR <11:0> on line 55, is appended to physical address bits <2:0> on line 38 and fed to the SRAM array 24. Thus, when an address within a page in the DRAM array 22 is addressed, the corresponding address within the proper allocated page of the SRAM array 24 is accessed.

For example, address=0 is transmitted on physical address lines <18:0>. The tag array 50 receives address bits <18:3>, which translates to address=0. The DRAM array 22 also receives address=0. The pointer 46 references an entry in the page stack 40 having a value of 1 in its data field 44, i.e. PAGE_STACK_ENTRY <11:0>=1. This value is loaded into tag address=0 and stored in the tag entry data field 54, e.g. TAG_MAP_ADDR <11:0>=1. Thus, the data field 54 of the tag entry at address=0 links to address=1 of a page in the SRAM array 24; the page encompassing address=0 of the DRAM array 22 is shadowed by the page at address=1 of the SRAM array 24.

Figure 7:
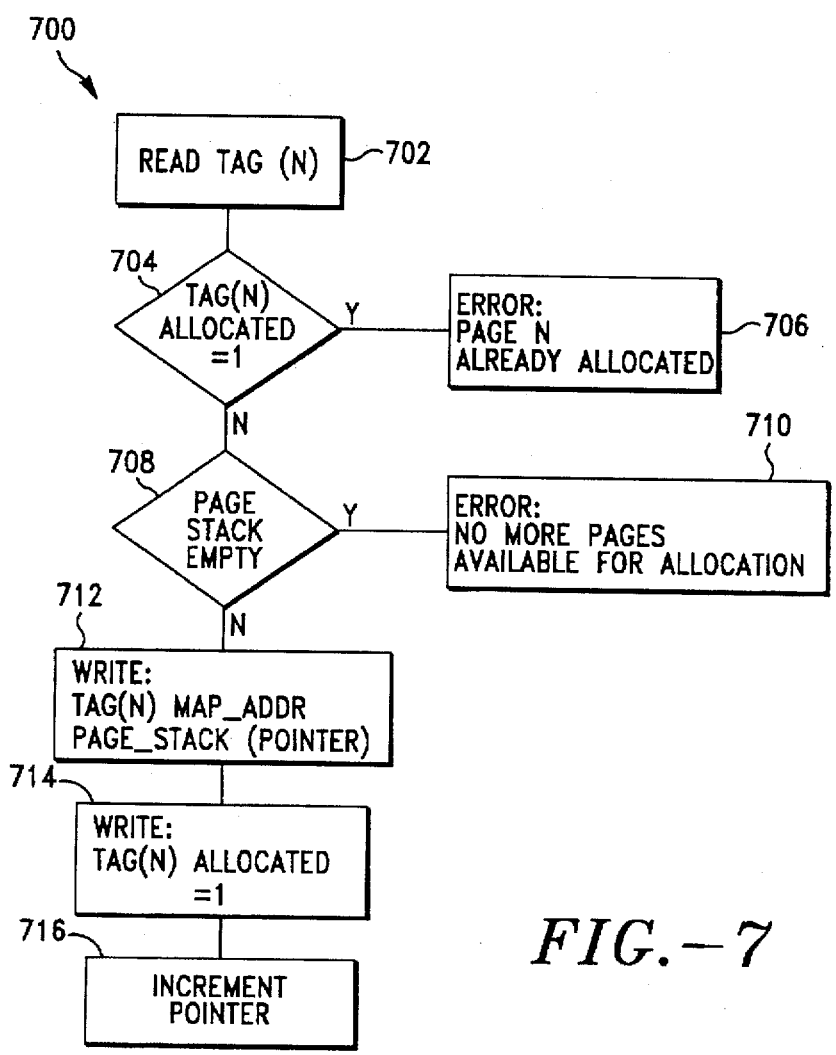
FIG. 7 is a flow chart setting forth the steps for allocating a portion of the non-volatile storage capability of FIG. 2.

FIG. 7 sets forth the sequence 700 followed by the memory arrangement in response to a request, by the CPU 18 to allocate a page in the SRAM array 24. The allocation command initiated by CPU 18 is received by the control unit 32 and includes a physical address N; address bits <18:3> of physical address N are presented to the tag array 50 to reference a location therein. The data field 54 of the tag entry located at tag address equals N is then examined in step 702 via a read operation from the control unit 32, i.e. Read Tag (N).

The control unit 32 then checks the allocate bit in step 704 to determine if it is set, i.e. equal to 1. If it is set, a page in the SRAM array 24 has already been allocated to shadow a page in the DRAM array 22 referenced by physical address N. This results in an error situation in step 706 and a request from the memory subsystem 20 to the CPU 18 to perform an error routine. If the allocate bit is not set, i.e. equal to zero, the page of DRAM at physical address N is not currently shadowed and may be allocated a shadow page of SRAM. The next step 708 in the sequence is a determination of whether the page stack 40 is empty, i.e. whether the pointer 46 references the bottom of the stack 40, thus indicating no available SRAM pages. If the stack 40 is empty, another error signal is sent to the CPU 18 in step 710 requesting service for an error.

Figure 7A:
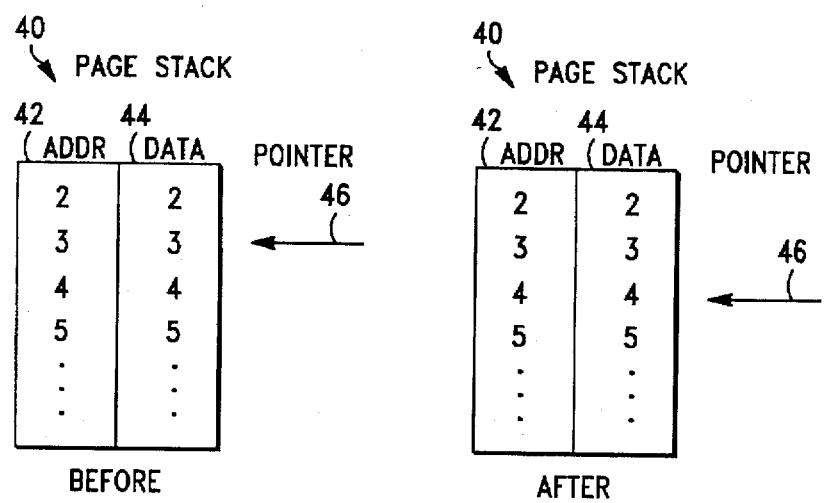
FIG. 7A is a diagram illustrating the allocation process in accordance with FIG. 7.

If the page stack 40 is not empty, i.e. there are available SRAM pages, the control unit 32 initiates a series of write operations. The contents of the data field 44 of the current page stack entry, i.e. page_stack (POINTER), are stored in the data field 54 of the tag entry referenced by the physical DRAM address; i.e. TAG (N), in step 712. This is called the tag-map address (TAG_MAP_ADDR) (refer again to FIG. 3), and it links the physical address of the DRAM array 22 to the address of the shadowing SRAM page. For example, if the page at address=1 of the SRAM array 24 is shadowing the page encompassing physical address=10 of the DRAM array 22, address=1 is stored in the data field 54 of the tag entry referenced by DRAM address=10. Thereafter in step 714, the control unit 32 sets the allocate bit via line 53 for the current tag entry and, in step 716, the pointer 46 increments. FIG. 7A depicts the status of the page stack 40 before and after an allocation request.

The control unit 32 also directs the placing of deallocated SRAM pages back on the page stack 40. Refer now to FIG. 8A. The value in the pointer register 48 references address=4 of the page stack 40, whose data field 44 contains the address of the next page to be allocated in the SRAM array 24, e.g. address=4. The server CPU 18 now requests the deallocation of the page at address=1 in the SRAM array 24 by referencing its corresponding physical DRAM address=10. The SRAM page address=1 is stored in the data field 44 of a page stack entry having address=1, and is now placed "on the top" of the page stack 40. The address=1 is then stored in the pointer register 48 as the next page to be allocated.

Figure 8:
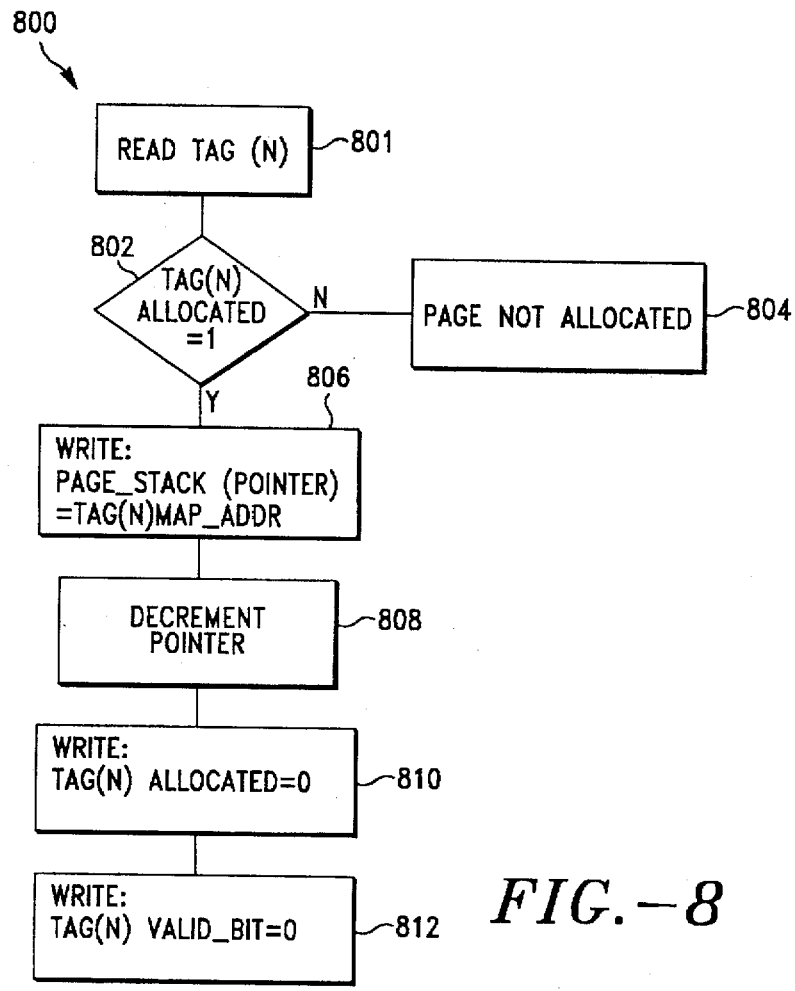
FIG. 8 is a flow chart setting forth the steps for deallocating a portion of the non-volatile storage capability of FIG. 2.
Figure 8A:
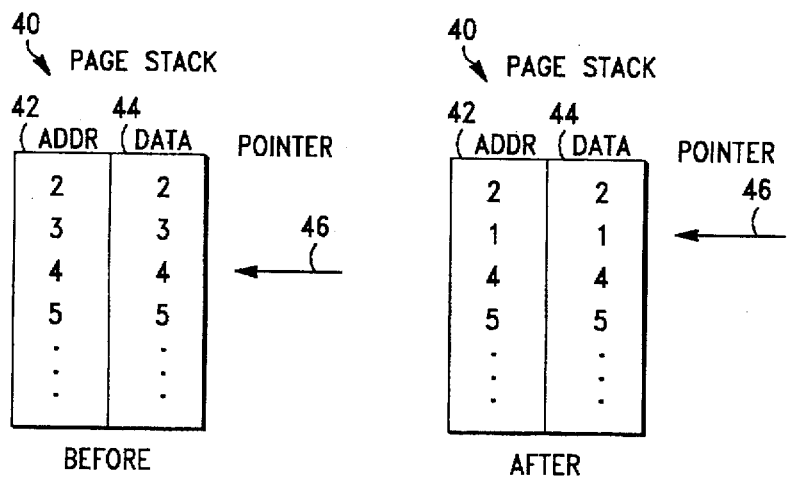
FIG. 8A is a diagram illustrating the deallocation process in accordance with FIG. 8.

FIG. 8 illustrates the deallocate process at 800. Physical address N is transferred to the memory subsystem 20 as part of a request by the server CPU 18 to deallocate the page in the SRAM array 24 shadowing the DRAM page at address N. The tag entry referenced by the physical address N is then examined by the control unit 32 (step 801). More specifically, the contents of the data field 54 of the tag entry are checked in step 802 to determine if the allocate bit is set. If the bit is not set, an error condition arises at step 804. If the allocate bit is set, the CPU 18 may request deallocation.

A series of write operations are then initiated by the control unit 32 to ensure that the page is placed on the top of the stack 40 and is referenced by the pointer 46. To that end, in step 806 the contents of the data field 54 in the tag entry referenced by physical address N are stored in the page stack entry located at an address equal to (POINTER−1); the pointer 46 is then decremented at step 808. The allocate bit is cleared by a write operation storing 0 in the allocate field 56 of the tag entry at step 810; the valid bit in field 58 is likewise cleared in step 812.

Figure 9:
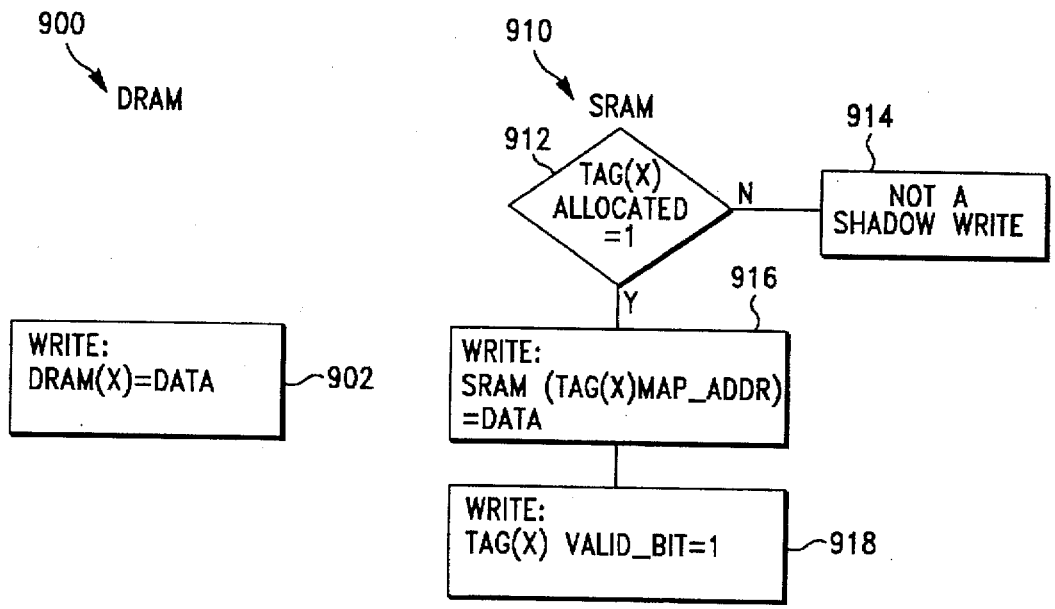
FIG. 9 is a diagram illustrating the sequence of steps occuring in the memory arrangement of FIG. 2 during a write operation.
Figure 9A:
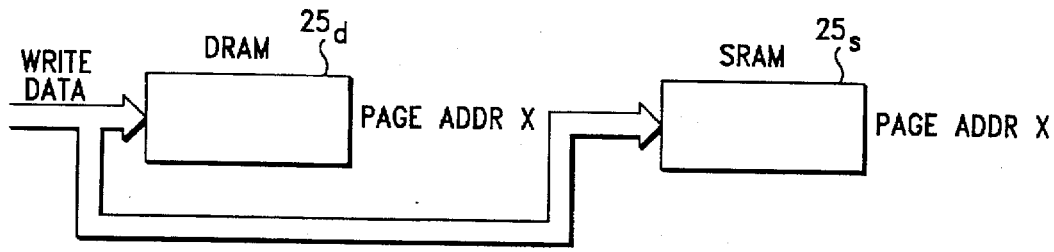
FIG. 9A is a diagram illustrating the write operation of FIG. 9.

Once a page in the SRAM array 24 is linked to a page in the DRAM array 22, every write operation performed to the page of DRAM is also performed to the page of SRAM. See FIG. 9A. The write operation to the SRAM page $25_s$ is referred to as a "shadow write" operation because the data stored in that page matches, or "shadows", the data in the DRAM page $25_d$. FIG. 9 depicts flow diagrams of the events transpiring for a write operation.

The DRAM column at 900 sets forth the activity in the DRAM array 22. A normal write operation to the memory subsystem 20 consists of storing data at a location in the DRAM array 22 having a physical address X (step 902).

The SRAM column at 910 sets forth the activities in the SRAM array 24 for a normal write operation to the memory subsystem 20. For every write operation, the tag array 50 is examined to determine whether the SRAM page referenced by the physical address is allocated. Thus, in step 912, the allocate field 56 of the tag entry referenced by the physical address X is checked by the control unit 32. If the allocate bit is not set, a shadow write is not required (step 914). If the allocate bit is set, then in step 916 the data stored in the DRAM array 22 is also stored in the SRAM array 24 at the address TAG_MAP_ADDR <11:0> appended to physical address <2:0> (see FIG. 3). In this case, a "shadow write" operation is performed to the SRAM array 24.

Finally, the bit in the valid field 58 of the current tag entry is set at step 918. The setting of the valid bit provides an additional mapping link between the SRAM pages and the DRAM pages. If the computer system 10 were to lose power during a write operation, a mechanism is needed to determine whether data was stored in the SRAM array 24 prior to the power loss; otherwise, the data present in the SRAM page address may not be valid and correct. The setting of the valid bit indicates that the data is valid.

FIGS. 10 and 10A depict a "normal" read operation; that is, a read operation that occurs during normal system operation. A normal read function implies no loss of power, no attempt to retrieve data from safe storage and thus, no data recovery. Although shadowing may have occurred, read requests issued by the CPU 18 are serviced by the memory subsystem 20 by accessing the data stored in the DRAM array 22 (step 1010). There is no need to access the SRAM array 24 or the tag array 50 (step 1020).

Figure 11A:
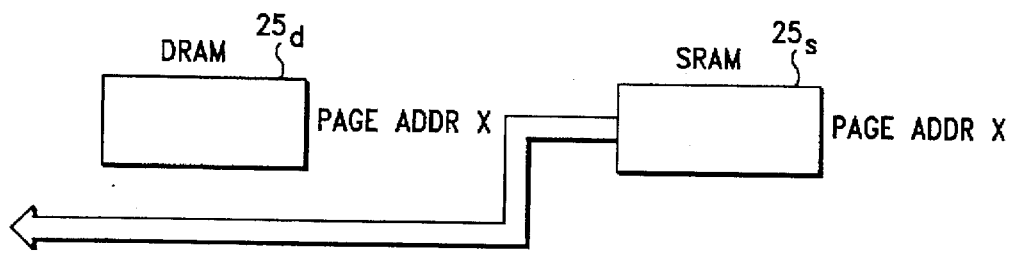
FIG. 11A is a diagram illustrating the data retrieval process in accordance with FIG. 11.
Figure 11:
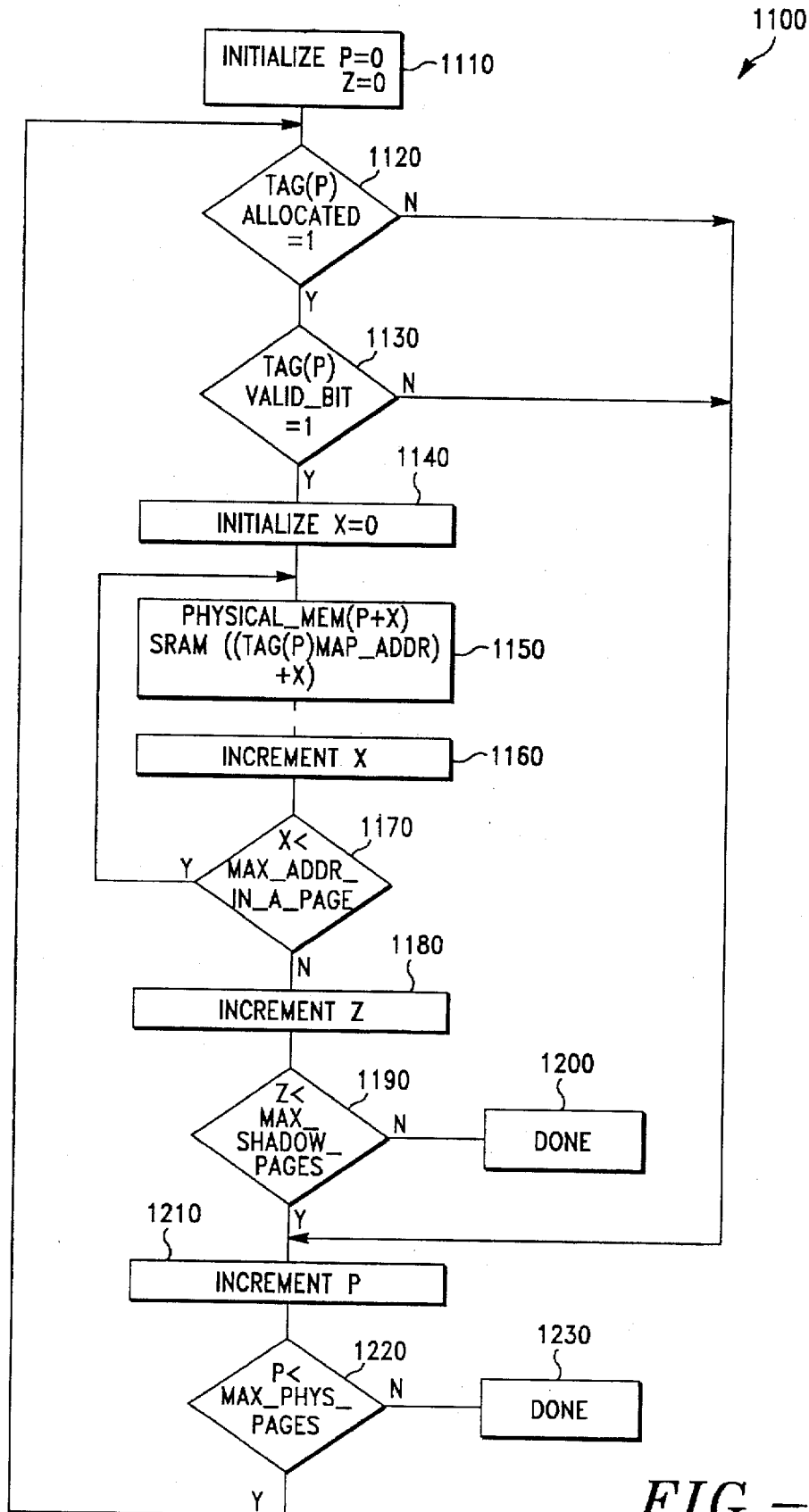
FIG. 11 is a flow chart setting forth the sequence of steps followed by the memory arrangement of FIG. 2 to retrieve data safely stored on the non-volatile array after a power loss.

In accordance with the teachings of the invention, data designated for safe storage by the CPU 18 is stored in the SRAM array 24 of the memory subsystem 20; the data is thus safe from catastrophic power losses of the computer system 10. Portions of the control unit 32, e.g. the tag array 50 and page stack array 40, are also preserved during this time. After the computer system 10 has recovered power, the data is retrieved from the SRAM array 24. See FIG. 11A. A recovery procedure is performed by the CPU 18 and the control unit. FIG. 11 sets forth the recovery process at 1100.

A physical page count P and a shadow page count Z are initialized to zero at step 1110. The physical page count P represents the number of pages contained within the DRAM array 22, e.g. 64K. The page count P also corresponds to the number of addressable locations within the tag array 50, i.e. 64K. Accordingly, the physical page count P is equivalent to the higher-order physical address bits <18:3> received by the tag array 50. The shadow page count Z represents the number of pages contained within the SRAM array 24, e.g. 4K.

The data field 54 of the tag array 50 at the physical page count P address is then accessed. Specifically, the allocate bit in field 56 of the tag entry associated with the physical page count P is checked by the control unit 32 in step 1120. The purpose of this inquiry is to determine whether a page in the SRAM array 24 is shadowing a page in the DRAM array 22, i.e. to identify a link between the physical address and a page in the SRAM array 24. If there is a link, the next determination is whether the SRAM page contains valid data. The valid bit in field 58 of the tag entry is examined in step 1130 and if set, indicates at least one write operation was performed to that address. Thus, data is preserved at that location. If a link does not exist or if valid data is not preserved at the physical page count address, then P is incremented (see flow beginning at step 1210).

The data contents of each address within the preserved SRAM page is then copied from the SRAM array 24 to the DRAM array 22 using the TAG_MAP_ADDR address bits <11:0> in data field 54 associated with the physical page count P as the link between the shadow SRAM page and the DRAM page. Address count X represents the number of addressable locations within a page which, for a typical embodiment of the invention, is eight (8) addresses. Accordingly, the address count X is equivalent to the lower-order address bits <2:0> received by the SRAM array 24. Address count X is initially set to zero at step 1140 and then appended to the TAG_MAP_ADDR address bits as each address of the SRAM page is copied at step 1150. The address count X is incremented at step 1160 and compared to the maximum addressable locations in a page, i.e. MAX_ADDR_IN_A_PAGE, to determine whether there are more addresses to copy (step 1170).

After the entire shadow SRAM page has been copied to the corresponding page in DRAM array 22, the shadow page count Z and the physical page count P are incremented at steps 1180 and 1210, respectively. The recovery procedure is completed at steps 1200 and 1230 when either all of the shadow SRAM pages have been recovered, i.e. as a result of the comparison at step 1190, or the tag status of all of the DRAM pages has been checked as a result of the comparison at step 1220.

The memory arrangement described herein offers a new and unique way of integrating volatile and non-volatile storage to provide flexible and efficient use of the high-bandwidth SRAM array 24. The page-oriented architecture and page allocation circuitry places the non-volatile storage capability exactly where needed, resulting in a powerful, cost-effective memory arrangement compared to prior intermediate memory systems using larger non-volatile arrays. In that most applications do not require large SRAM array capability, the invention is basically a DRAM memory subsystem with an added SRAM feature. However, the resulting memory arrangement significantly reduces performance bottlenecks involved in direct I/O data transfers to secondary storage devices.

While there has been shown and described a preferred embodiment, it is to be understood that various other adaptations and modifications may be made within the spirit and scope of the invention. For example, the invention is equally applicable to memory configurations having DRAM-to-SRAM ratios other than that described herein. The amount and type of storage provided by the memory subsystem depends upon the transactions and characteristics of the applications residing on the clients. Performance simulation is thus required to determine the ratio of SRAM-to-DRAM needed for a particular system configuration. Similarly, other granularities of the "page" may be used depending upon the capability of the memory system to manage the data, i.e. if the page boundaries are too small, more pages will be needed to shadow a quantum of data.

It will therefore be apparent to those skilled in the art that various changes and modifications in the specifically described embodiments can be carried out without departing from the scope of the invention, which is to be limited only by the scope of the appended claims.

What is claimed is:

1. A memory system connected between a host central processing unit and a mass storage device having non-volatile secondary storage media, the memory system configured to provide intermediate non-volatile storage to protect data blocks destined for storage on the secondary storage media against loss from a system power failure, said memory system comprising:

a first subsystem of storage elements providing volatile storage of data blocks including the data blocks destined for storage on said secondary storage media;

a second subsystem of storage elements providing non-volatile storage of data blocks stored in said first subsystem which have not yet been stored on the secondary storage media, the block storage capacity of said second subsystem being substantially less than the block storage capacity of said first subsystem; and a hardware mapping logic unit responsive to block shadow mapping commands from the central processing unit and coupled between said first and second subsystems for mapping block storage address locations of said first subsystem for said data blocks which have not yet been stored on the secondary storage media to block storage address locations of the second subsystem to enable the second subsystem automatically to shadow and store said blocks as said blocks are written by said host central processing unit to the mapped block storage locations of said first subsystem without requiring a separate write operation of said host central processing unit to said second subsystem.

2. The memory system of claim 1 wherein said first and second subsystems are apportioned into pages configured to store said data blocks.

3. The memory system of claim 1 wherein said mapping logic unit comprises shadow block maintaining means for maintaining a list of second subsystem block storage locations available to shadow corresponding first subsystem block storage locations.

4. The memory system of claim 3 wherein said shadow block maintaining means includes a page stack capable of storing a plurality of page stack entries.

5. The memory system of claim 4 wherein said page stack comprises a plurality of data fields and address fields referenced by a pointer.

6. The memory system of claim 5 wherein each of said data fields contains a page stack entry identifying a block storage location address in said second subsystem.

7. The memory system of claim 6 wherein each of said address fields contains an address for each page stack entry in said page stack.

8. The memory system of claim 7 wherein said pointer contains an address of a page stack entry identifying said particular one of said block locations of said second subsystem available to shadow a corresponding block location of said first subsystem.

9. The memory system of claim 3 wherein said mapping logic unit comprises means for linking said block storage locations of said second subsystem to said block storage locations of said first subsystem.

10. The memory system of claim 9 wherein said linking means includes a page stack and a tag storage array, the page stack for allocating available shadow block storage locations of said second subsystem, and said tag storage array for linking said block storage locations of said first subsystem to said available shadow block storage locations of said second subsystem.

11. The memory system of claim 10 wherein said tag storage array comprises non-volatile storage for a plurality of data fields and address fields.

12. The memory system of claim 11 wherein each of said data fields contains a tag entry stored in said page stack for linking a block storage location address of said first subsystem with an available shadow block storage location address of said second subsystem.

13. The memory system of claim 12 wherein each of said data fields further contains allocation determining means for determining if a particular one of said shadow block storage locations of said second subsystem has been allocated to shadow a corresponding block storage location of said first subsystem.

14. The memory system of claim 13 wherein said allocation determining means comprises means for writing and reading an allocate bit in a said data field.

15. The memory system of claim 14 wherein each of said data fields further contains valid data determining means for determining if said particular one of said shadow block storage locations of said second subsystem contains valid data not yet written to said secondary storage media.

16. The memory system of claim 15 wherein said valid data determining means comprises means for writing and reading a valid bit in a said data field.

17. The memory system of claim 16 wherein said address field of said tag storage array contains an address that identifies one of said plurality of tag entries, said address corresponding to one of said data blocks in said first subsystem.

18. The memory system of claim 1 wherein said secondary storage media comprises a magnetic mass storage device within a classification of hard disk drives and tape drives.

19. The memory system of claim 1 wherein the hardware mapping logic unit includes shadow block reallocation means responsive to shadow mapping deallocation commands from said central processing unit for releasing shadow block storage locations of said second subsystem containing said data blocks determined to be written to said non-volatile secondary storage media.

20. The memory system of claim 1 wherein the first memory subsystem comprises a dynamic random access memory array, and wherein the second memory subsystem comprises a battery backed-up static random access memory array.

21. A memory system of a computer including a central processing unit and a mass storage device providing non-volatile secondary storage media, the memory system configured to provide intermediate non-volatile storage of data destined for the secondary storage media during a computer power loss, said memory system comprising:

a dynamic random access memory (DRAM) array of storage elements apportioned into DRAM pages configured to provide volatile storage of data destined for said secondary storage media;

a static random access memory (SRAM) array of storage elements apportioned into SRAM pages configured to provide non-volatile storage of data corresponding to selected data stored in said DRAM array, the storage capacity of said SRAM array being substantially less than the storage capacity of said DRAM array;

a hardware mapping logic unit responsive to page shadow mapping commands from the central processing unit and coupled between said DRAM array and said SRAM array for mapping page storage locations of said DRAM array for said data pages which have not yet been stored on the secondary storage media to page storage locations of the SRAM array to enable the SRAM array automatically to shadow and store said pages simultaneously as said pages are written by said host central processing unit to the mapped page storage locations of said DRAM array without requiring a separate write operation of said host central processing unit to the SRAM array, said hardware mapping logic unit including:

allocation determining means for determining if a particular one of said SRAM pages has been allocated to shadow a corresponding DRAM page; and valid data determining means for determining if said particular one of said SRAM pages contains valid data;

whereby after the power loss, said data stored in said particular one of said SRAM pages is retrieved in response to said particular one of said SRAM pages having been allocated and said particular one of said SRAM pages having valid data.

22. The memory system of claim 21 wherein said hardware mapping logic unit comprises:

a page stack for maintaining a list of SRAM pages available to shadow corresponding DRAM pages; and a tag array for linking said SRAM pages to said DRAM pages, said tag array including a plurality of data fields.

23. The memory system of claim 21 wherein said hardware mapping logic unit comprises an allocate bit located in each of said data fields of said tag array; and said valid data determining means comprises a valid bit located in each of said data fields of said tag array.

24. A method for protecting data pages against loss in a computing system which have been modified by a central processing unit before being written onto non-volatile media of a mass storage device connected to the central processing unit, the method comprising the steps of:

providing a dynamic random access memory (DRAM) array of storage elements apportioned into DRAM pages configured for volatile storage of data pages including the data pages destined for said secondary storage media;

providing a battery-backed-up static random access memory (SRAM) array of storage elements apportioned into SRAM pages configured to provide non-volatile storage of the data pages stored in said DRAM array destined for said secondary storage media, the page storage capacity of said SRAM array being substantially less than the page storage capacity of said DRAM array;

mapping with a mapping logic unit responsive to page shadow mapping commands from the central processing unit page storage locations of said DRAM array for said data pages which are destined for said secondary storage media to available page storage locations of the SRAM array, and writing in a single writing step said data pages to page storage locations of said DRAM array and thereby automatically writing said data pages to shadow data page storage locations of said SRAM array mapped to the same page storage locations of said DRAM array by said mapping step.

* * * * *